United States Patent
Ogino et al.

(10) Patent No.: US 9,683,284 B2
(45) Date of Patent: *Jun. 20, 2017

(54) SPUTTERING TARGET FOR MAGNETIC RECORDING FILM

(75) Inventors: Shin-ichi Ogino, Ibaraki (JP); Yuichiro Nakamura, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 802 days.

This patent is subject to a terminal disclaimer.

(21) Appl. No.: 13/982,051

(22) PCT Filed: Mar. 23, 2012

(86) PCT No.: PCT/JP2012/057482
§ 371 (c)(1),
(2), (4) Date: Jul. 26, 2013

(87) PCT Pub. No.: WO2012/133166
PCT Pub. Date: Oct. 4, 2012

(65) Prior Publication Data
US 2013/0306470 A1    Nov. 21, 2013

(30) Foreign Application Priority Data
Mar. 30, 2011   (JP) .................... 2011-075566

(51) Int. Cl.
*C23C 14/34*    (2006.01)
*C22C 1/04*     (2006.01)
(Continued)

(52) U.S. Cl.
CPC ............ *C23C 14/3407* (2013.01); *C22C 1/00* (2013.01); *C22C 1/02* (2013.01); *C22C 1/0466* (2013.01);
(Continued)

(58) Field of Classification Search
CPC ... C23C 14/3407; C23C 14/3414; C22C 1/00; C22C 1/02; C22C 1/0466; C22C 1/10;
(Continued)

(56) References Cited

U.S. PATENT DOCUMENTS 6,406,600 B1   6/2002   Takashima
6,759,005 B2   7/2004   Zhang
(Continued)

FOREIGN PATENT DOCUMENTS

JP    02-034536 A    2/1990
JP    06-267063 A    9/1994
(Continued)

*Primary Examiner* — John Brayton
(74) *Attorney, Agent, or Firm* — Howson & Howson, LLP

(57) ABSTRACT

A sputtering target for a magnetic recording film which contains carbon, the sputtering target is characterized in that the ratio ($I_G/I_D$) of peak intensities of the G-band to the D-band in Raman scattering spectrometry is 5.0 or less. The sputtering target for a magnetic recording film, which contains carbon powders dispersed therein, makes it possible to produce a magnetic thin film having a granular structure without using an expensive apparatus for co-sputtering; and in particular, the target is an Fe—Pt-based sputtering target. Carbon is a material which is difficult to sinter and has a problem that carbon particles are apt to form agglomerates. There is hence a problem that carbon masses are readily detached during sputtering to generate a large number of particles on the film after sputtering. The high-density sputtering target can solve these problems.

10 Claims, 3 Drawing Sheets

(51) Int. Cl.
*C22C 1/10* (2006.01)
*C22C 5/04* (2006.01)
*C22C 30/00* (2006.01)
*C22C 33/02* (2006.01)
*G11B 5/851* (2006.01)
*C22C 38/00* (2006.01)
*C22F 1/14* (2006.01)
*C22C 1/00* (2006.01)
*C22C 1/02* (2006.01)

(52) U.S. Cl.
CPC ............. *C22C 1/10* (2013.01); *C22C 5/04* (2013.01); *C22C 30/00* (2013.01); *C22C 33/0228* (2013.01); *C22C 33/0278* (2013.01); *C22C 38/002* (2013.01); *C22F 1/14* (2013.01); *C23C 14/3414* (2013.01); *G11B 5/851* (2013.01)

(58) Field of Classification Search
CPC ....... C22C 5/04; C22C 30/00; C22C 33/0228; C22C 33/0278; C22C 28/002; C22F 1/14; G11B 5/851
USPC .................................................. 204/298.13
See application file for complete search history.

(56) References Cited

U.S. PATENT DOCUMENTS

| | | | | |
|---|---|---|---|---|
| 7,241,520 B2* | 7/2007 | Shin | ........................ | G11B 5/653 428/836.3 |
| 8,173,282 B1* | 5/2012 | Sun | ........................ | G11B 5/65 204/192.1 |
| 2004/0110035 A1 | 6/2004 | Shin et al. | | |
| 2006/0093868 A1 | 5/2006 | Honda | | |
| 2007/0189916 A1 | 8/2007 | Zhang | | |
| 2008/0057350 A1 | 3/2008 | Das et al. | | |
| 2009/0148764 A1* | 6/2009 | Kwak | ........................ | H01M 6/40 429/162 |
| 2009/0242393 A1* | 10/2009 | Satoh | ........................ | C23C 14/3414 204/298.13 |
| 2011/0247930 A1 | 10/2011 | Sato | | |
| 2011/0309349 A1* | 12/2011 | Matsuura | ........................ | H01L 51/5218 257/40 |
| 2012/0118734 A1 | 5/2012 | Sato et al. | | |
| 2012/0225325 A1* | 9/2012 | Nemoto | ........................ | G11B 5/65 428/829 |
| 2013/0134038 A1 | 5/2013 | Sato et al. | | |
| 2013/0168240 A1* | 7/2013 | Ogino | ........................ | C23C 14/3414 204/298.13 |
| 2013/0213803 A1 | 8/2013 | Sato et al. | | |
| 2014/0083847 A1 | 3/2014 | Sato | | |
| 2014/0231250 A1* | 8/2014 | Ogino | ........................ | C22C 30/00 204/298.13 |
| 2014/0346039 A1* | 11/2014 | Ogino | ........................ | C22C 5/04 204/298.13 |
| 2014/0360871 A1 | 12/2014 | Sato et al. | | |
| 2015/0060268 A1 | 3/2015 | Ogino | | |

FOREIGN PATENT DOCUMENTS

| | | |
|---|---|---|
| JP | 2000-207735 A | 7/2000 |
| JP | 2000-268357 A | 9/2000 |
| JP | 2000-306228 A | 11/2000 |
| JP | 2000-311329 A | 11/2000 |
| JP | 2003-028802 A | 1/2003 |

* cited by examiner

SPUTTERING TARGET FOR MAGNETIC RECORDING FILM

BACKGROUND

The present invention relates to a sputtering target, in particular, a Fe—Pt-based sputtering target with carbon (C) powders dispersed therein, for producing thermally assisted magnetic recording media.

In the field of magnetic recording represented by hard disk drives, ferromagnetic metal materials, i.e., Co, Fe, or Ni-based materials, are used as materials of magnetic thin films in magnetic recording media. For example, in the magnetic thin film of a hard disk employing a longitudinal magnetic recording system, a Co—Cr or Co—Cr—Pt ferromagnetic alloy mainly composed of Co is used.

In magnetic thin films of hard disks employing a perpendicular magnetic recording system that has been recently applied to practical use, composite materials each composed of a Co—Cr—Pt ferromagnetic alloy mainly composed of Co and a nonmagnetic inorganic material are widely used. In many cases, the magnetic thin film is produced by sputtering a sputtering target of which main component is the above-mentioned material with a DC magnetron sputtering apparatus because of its high productivity.

Incidentally, the recording density of a hard disk is rapidly increasing year by year, and it is predicted that the areal recording density will reach 1 Tbit/in$^2$ in the future, whereas the current areal recording density is 600 Gbit/in$^2$. In order to achieve a recording density of 1 Tbit/in$^2$, the recording bit size must be reduced to 10 nm or less. In such a case, occurrence of a problem of superparamagnetization by thermal fluctuation is predicted. The magnetic recording medium materials currently used, e.g., Co—Cr-based alloys having enhanced crystal magnetic anisotropy by containing Pt therein, are predicted to be insufficient for preventing the problem, and magnetic particles that behave as a stable ferromagnetic material in a size of 10 nm or less need to have higher crystal magnetic anisotropy.

Based on the above-described circumstances, a Fe—Pt phase having a $L1_0$ structure has attracted attention as a material for ultra-high density recording media. The Fe—Pt phase having a $L1_0$ structure has not only high crystal magnetic anisotropy but also excellent corrosion resistance and oxidation resistance and is therefore expected as a material that can be applied to magnetic recording media.

In order to use the Fe—Pt phase as a material for an ultra-high density recording medium, it is necessary to develop a technology of dispersing Fe—Pt magnetic particles regulated in the same direction with a density as high as possible in a magnetically isolated state.

Accordingly, a magnetic thin film having a granular structure in which Fe—Pt magnetic particles having a $L1_0$ structure are isolated from one another by a nonmagnetic material such as an oxide or carbon has been proposed as a magnetic film for a magnetic recording medium of the next-generation hard disk employing a thermally assisted magnetic recording system.

The granular magnetic thin film has a structure in which the magnetic particles are magnetically isolated from one another by means of the intervention of a nonmagnetic material.

Magnetic recording media including magnetic thin films having a granular structure are described in literatures such as Patent Literatures 1 to 5.

Among the granular magnetic thin films including a Fe—Pt phase having the $L1_0$ structure, a magnetic thin film containing 10 to 50% by volume of carbon as a nonmagnetic material has particularly attracted attention from its high magnetic characteristics. Such a granular magnetic thin film is known to be produced by simultaneously sputtering a Fe target, a Pt target, and a C target or simultaneously sputtering a Fe—Pt alloy target and a C target. However, in order to simultaneously sputter these sputtering targets, an expensive co-sputtering apparatus is necessary.

In general, sputtering of a sputtering target containing a nonmagnetic material in an alloy with a sputtering apparatus has problems of causing unintended detachment of the nonmagnetic material during sputtering or generation of particles (dust adhered to a substrate) due to abnormal discharge occurring from holes present in the sputtering target. In order to solve these problems, it is necessary to enhance the adhesion between the nonmagnetic material and the base alloy and to increase the density of the sputtering target. In general, the sputtering target material of an alloy containing a nonmagnetic material therein is produced by a powder sintering method. However, in the case of a Fe—Pt alloy containing a large amount of C, preparation of a sintered compact having a high density is difficult since C is a material of which sintering is difficult.

As described above, a Co—Cr—Pt alloy has been widely used as the magnetic phase of a perpendicular magnetic recording layer until now. Here, an increase in the recording density needs a reduction of the Co alloy size per bit and also causes a problem of superparamagnetization by thermal fluctuation. Thus, Fe—Pt having a high crystal magnetic anisotropy is attracting attention.

In general, a magnetic recording layer is composed of a magnetic phase such as Fe—Pt and a nonmagnetic phase isolating the magnetic phase, and it is known that carbon is one material that is effective as the nonmagnetic phase.

However, carbon is a material of which sintering is difficult and is apt to form agglomerates. There is hence a problem that carbon masses are readily detached during sputtering to generate a large number of particles on the film after sputtering.

In spite of trails for improvement of magnetic recording layers has been made by introducing carbon into a target, the problems in sputtering of the target has not been solved yet.

In addition, formation of a carbon film is proposed. For example, Patent Literature 6 describes a magnetic disk including an amorphous hydrogenated carbon layer having one wave peak (A) at a position of 1545 cm$^{-1}$ or less and another wave peak (B) at a position of 1320 to 1360 cm$^{-1}$ and an area ratio (B/A) of these waves at the half-value widths of the peaks in 0.3 to 0.7 and describes a method of producing the magnetic disk.

Patent Literature 7 describes a method of evaluating a carbon film having a step of evaluating the film quality of the carbon film based on the ratio $I_D/I_G$ of the intensity $I_D$ of a band D (disorder) having a peak at about 1350 to 1450 cm$^{-1}$ to the intensity $I_G$ of a band G (graphite) having a peak at about 1550 to 1650 cm$^{-1}$ in a surface-enhanced Raman spectrum and a step of confirming whether the $I_D/I_G$ is in the range of 0.1 to 0.5 and describes a method of producing a magnetic recording medium.

However, the methods described in Patent Literatures 6 and 7 are merely evaluation of carbon films and do not directly relate to these cases; namely, influence of carbon on a sputtering target when a large amount of carbon is present in the magnetic metal that is a main constituent material of the target for forming a magnetic recording film, the behavior of carbon in the step of producing the target, and the influence on formation of a film in sputtering using the target. Thus, in the aforementioned methods, the influence and behavior are not sufficiently revealed.

Patent Literatures 8 and 9 evaluate a SiC- or C-based thin film of a magnetic recording medium by a Raman spectrum, though, do not directly relate to these cases; namely, influence of carbon on a sputtering target when a large amount of carbon is present in the magnetic metal that is a main constituent material of the target for forming a magnetic recording film, the behavior of carbon in the step of producing the target, and the influence on formation of a film in sputtering using the target. Thus, in the aforementioned methods, the influence and behavior are not sufficiently revealed.

PRIOR ART DOCUMENTS

Patent Document 1: Japanese Patent Application Laid-Open No. 2000-306228
Patent Document 2: Japanese Patent Application Laid-Open No. 2000-311329
Patent Document 3: Japanese Patent Application Laid-Open No. 2008-59733
Patent Document 4: Japanese Patent Application Laid-Open No. 2008-169464
Patent Document 5: Japanese Patent Application Laid-Open No. 2004-152471
Patent Document 6: Japanese Patent Application Laid-Open No. Hei 06-267063
Patent Document 7: Japanese Patent Application Laid-Open No. 2003-028802
Patent Document 8: Japanese Patent Application Laid-Open No. 2000-268357
Patent Document 9: Japanese Patent Application Laid-Open No. 2006-127621

SUMMARY OF THE INVENTION

Technical Problem

The present invention allows production of a magnetic thin film having a granular structure without using an expensive co-sputtering apparatus and provides a sputtering target, in particular, a Fe—Pt-based sputtering target, for a magnetic recording film, where C powders are dispersed in the target. It is an object of the present invention to provide a high-density sputtering target that can solve the problems that carbon is a material of which sintering is difficult and is apt to form agglomerates and that carbon masses are readily detached during sputtering to generate a large number of particles on the film after sputtering.

Solution to Problem

The present inventors have diligently studied for solving the problems and, as a result, have found that it is possible to produce a high density sputtering target and to notably reduce occurrence of particles by improving the material quality of C as a nonmagnetic material and uniformly and finely dispersing the particles in a base metal, that is, it is possible to increase the yield of film formation.

The present invention was accomplished based on these findings and provides:

1) A carbon-containing sputtering target for a magnetic recording film, wherein the ratio ($I_G/I_D$) of peak intensities of a G-band to a D-band in Raman scattering spectrometry of the sputtering target is 5.0 or less;

2) The sputtering target for a magnetic recording film according to 1) above, the sputtering target being composed of carbon and a metal component having a composition including 5 mol % or more and 60 mol % or less of Pt and the balance of Fe;

3) The sputtering target for a magnetic recording film according to 1) or 2) above, wherein the content of carbon is 5 mol % or more and 70 mol % or less;

4) The sputtering target for a magnetic recording film according to any one of 1) to 3) above, the sputtering target having a relative density of 90% or more;

5) The sputtering target for a magnetic recording film according to any one of 1) to 4) above, the sputtering target further including 0.5 mol % or more and 20 mol % or less of at least one additional element selected from B, Ru, Ag, Au, and Cu; and 6) The sputtering target for a magnetic recording film according to any one of 1) to 5) above, the sputtering target further including 0.5 mol % or more and 20 mol % or less of at least one oxide additive selected from $SiO_2$, $Cr_2O_3$, CoO, $Ta_2O_5$, $B_2O_3$, MgO, and $Co_3O_4$.

Effects of Invention

The sputtering target for a magnetic recording film of the present invention allows production of a magnetic thin film having a granular structure without using an expensive co-sputtering apparatus, and provides a sputtering target for a magnetic recording film. Particluraly, provided is a Fe—Pt-based sputtering target where C powders are dispersed in the target, and has an excellent effect of solving the problems that carbon is a material of which sintering is difficult and is apt to form agglomerages and that carbon masses are readily detached during sputtering to generate a large number of particles on the film after sputtering.

DETAILED DESCRIPTION OF THE INVENTION

Figure 1:
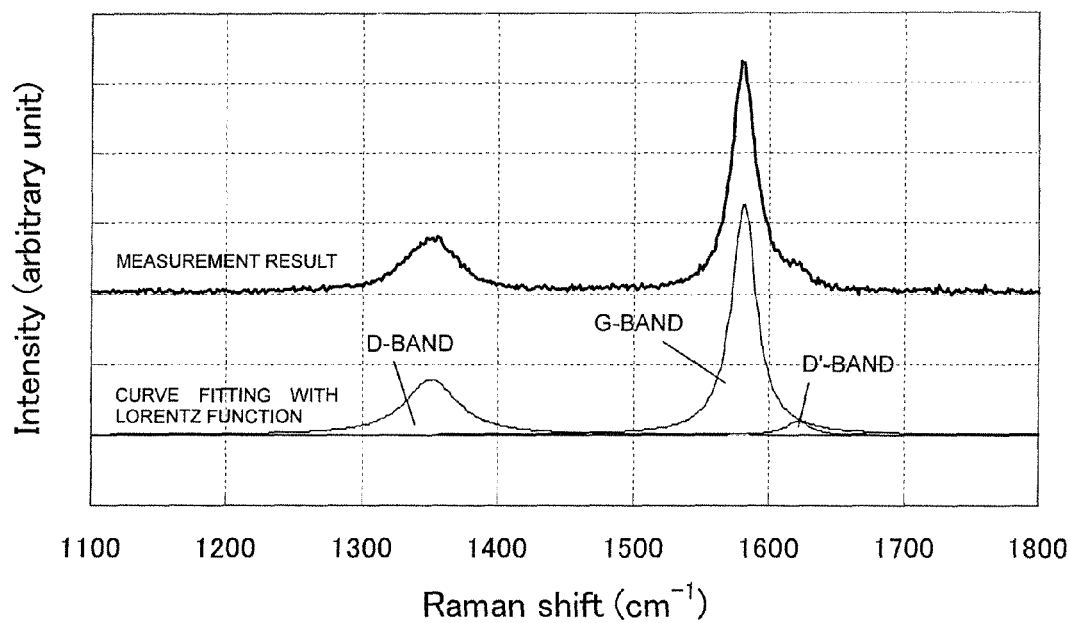
FIG. 1 shows a typical example of the Raman scattering spectrum of Fe—Pt—C and the result of curve fitting thereof.

A common carbon material excluding diamond has a strong covalent bond involving an $sp^2$ hybrid orbital, and it is difficult to cleave the covalent bond even in sputtering. Consequently, it is believed that masses of carbon atoms bound with covalent bonds fly directly as particles during sputtering.

Then, the present inventors came to think that intentional destruction of the crystallinity of carbon can improve the sputtering characteristics of the carbon material and reduce the occurrence of particles during sputtering; and found that the intensity ratio of the G (graphite) band to the D (disorder) band obtained in Raman scattering spectrometry of a sintered compact containing carbon shows a correlation with the number of particles generated during sputtering.

Accordingly, the sputtering target for a magnetic recording film of the present invention contains carbon (C), and the ratio ($I_G/I_D$) of peak intensities of the G-band to the D-band in Raman scattering spectrometry of the sputtering target is 5.0 or less.

Such a case is particularly effective in a sputtering target for a magnetic recording film composed of C and a metal component having a composition including 5 mol % or more and 60 mol % or less of Pt and the balance of Fe. The contents of these components are requirements for providing satisfactory magnetic characteristics.

The content of C is preferably 5 mol % or more and 70 mol % or less. A content of C in a target composition of less than 5 mol % may not provide sufficient magnetic characteristics, whereas a content of higher than 70 mol % may cause agglomerates of C powders to increase the occurrence of particles. In order to obtain desired magnetic characteristics, the content of C is desirably 20 mol % or more and 70 mol % or less.

The sputtering target for a magnetic recording film can have a relative density of 90% or more. The relative density of 90% or more is one of requirements of the present invention. A high relative density prevents the problem caused by degassing from the sputtering target during sputtering and enhances the adhesion between the alloy and the C powders. As a result, occurrence of particles is effectively prevented. The relative density is more preferably 95% or more.

The relative density in the present invention is a value determined by dividing the measured density of a target by the calculated density (theoretical density). The calculated density is a density when it is assumed that the constituent elements of a target do not diffuse to or react with each other and is calculated by the following on:

calculated density=Σ[(atomic weight of a constituent element)×(atomic ratio of the constituent element)]/Σ[(atomic weight of the constituent element)×(atomic ratio of the constituent element)/ (literature density data of the constituent element)], Expression wherein, Σ means the sum of the values of all constituent elements of the target.

The sputtering target for a magnetic recording film may further contain 0.5 mol % or more and 20 mol % or less of at least one additional element selected from B, Ru, Ag, Au, and Cu. The addition of these elements is optional, and these elements can be added depending on the sputtering target material for improving the magnetic characteristics.

The sputtering target for a magnetic recording film may further contain 0.5 mol % or more and 20 mol % or less of at least one oxide additive selected from $SiO_2$, $Cr_2O_3$, CoO, $Ta_2O_5$, $B_2O_3$, MgO, and $Co_3O_4$. The addition of these oxides is optional, and these oxides can be added depending on the sputtering target material for improving the magnetic characteristics.

As described above, it is difficult to cleave the covalent bond involving an $sp^2$ hybrid orbital in a carbon material even in sputtering. Thus, the covalent bond involving an $sp^2$ hybrid orbital in the carbon material is destroyed in advance for allowing the bonds between carbon atoms to be readily cleaved during sputtering. This prevents carbon from flying in large masses, resulting in a reduction of particles.

On this occasion, Raman scattering spectrometry can be employed as an index for evaluating the crystallinity (completeness of the $sp^2$ hybrid orbital) of a carbon material.

In evaluation of the crystallinity of a carbon material by Raman scattering spectrometry, vibration modes called G-band and D-band are measured.

The G-band is a vibration mode originated from the six-membered ring structure of graphite and appears as a peak at approximately 1570 $cm^{-1}$. The peak intensity increases with an increase in completeness of the crystalline structure.

The D-band is a vibration mode originated from the defect structure of graphite and appears as a peak at approximately 1350 $cm^{-1}$. The peak intensity increases with an increase of the defect.

FIG. 1 shows a typical example of the Raman scattering spectrum of Fe—Pt—C and the result of curve fitting thereof. As the Raman scattering spectrometer, Renishaw in Via Raman Microscope (manufactured by Renishaw plc.) was used. As the light source of excitation light, Compass™ 315M Diode-Pumped Laser (manufactured by Coherent, Inc.) was used at an excitation wavelength of 532 nm and an output of the excitation light source of 5 mW. A diffraction grating of 1800 L/mm was used. The Raman shift in the range of 1033 to 1842 $cm^{-1}$ was measured.

In the curve fitting of the measurement results, a Lorentz function was used. FIG. 1 shows the results in Example 2.

A D'-band also appears at approximately 1620 $cm^{-1}$ and is a vibration mode originated from a defect structure of graphite, but it does not directly relate to the present invention. As a matter of convenience of curve fitting, the D'-band is not used in the curve fitting and is merely shown in the figure.

In the present invention, the vibration modes of G-band and D-band in Raman scattering spectrometry are measured using a laser excitation wavelength of 532 nm. The excitation light source may be a gas laser such as an Ar laser, a He—Ne laser, or a Kr laser. These lasers can be appropriately selected depending on the desired excitation wavelength.

In the Raman spectrum of this case, an intensity $I_G$ of the G-band having a peak at 1520 to 1600 $cm^{-1}$ and an intensity $I_D$ of the D-band having a peak at 1320 to 1450 $cm^{-1}$ appear. The present invention can be applied to such a case.

From the above, the crystallinity of a carbon material can be evaluated by calculating the ratio of peak intensities of the G-band to the D-band (hereinafter, referred to as $I_G/I_D$ ratio). That is, a carbon material having higher crystallinity has a higher $I_G/I_D$ ratio. A crystalline structure having higher completeness (higher crystallinity) has a higher intensity of the G-band, and a crystalline structure having lower completeness (lower crystallinity) has a lower intensity of the G-band.

As obvious from the above, in the present invention, the crystallinity is reduced, namely, the crystallinity of a carbon material is intentionally destroyed to improve the sputtering characteristics and to reduce occurrence of particles during sputtering, and the ratio ($I_G/I_D$) of peak intensities of the G-band to the D-band in Raman scattering spectrometry of the sputtering target is reduced to 5.0 or less.

As a result, a problem that carbon is apt to form agglomerates is solved, and it is possible to prevent carbon masses from readily detaching during sputtering and to prevent a large amount of particles from occurring on the film after sputtering.

The lower limit of the ratio ($I_G/I_D$) of peak intensities of the G-band to the D-band is not particularly limited and is 1 or higher in many cases. A ratio ($I_G/I_D$) of peak intensities of 5.0 or less can effectively prevent occurrence of particles.

The sputtering target of the present invention is produced by a powder sintering method. Prior to the production, each raw material powder such as a typical example of a Fe, Pt and C powder is prepared. The Fe powder and the Pt powder desirably have an average particle diameter of 0.5 μm or more and 10 μm or less. If these raw material powders have too small particles, oxidation is facilitated to cause, for example, a problem of increasing the oxygen concentration in the sputtering target. Thus, the diameter is desirably 0.5 μm or more.

In contrast, if these raw material powders have large particle diameters, it is difficult to finely disperse C powders in the alloy. Thus, the particle diameter is further desirably 10 μm or less.

The C powder can be carbon black having an average primary particle diameter of 30 to 50 nm, graphite having an average particle diameter of 1 to 100 μm, or glassy carbon having an average particle diameter of 0.4 to 100 μm. The usable type of the C powder is not particularly limited. The C powder is appropriately selected and used depending on the type of the target.

Furthermore, as the raw material powder, an alloy powder such as a Fe—Pt powder, a Fe—Cu powder, a Pt—Cu powder, or a Fe—Pt—Cu powder may be used. These alloy powders also optionally contain various materials described in paragraphs [0024] and [0025] for improving the magnetic characteristics.

Though it depends on the composition, among the alloy powders, in particular, an alloy powder containing Pt is effective for reducing the amount of oxygen in the raw material powder. In also the case of using an alloy powder, the powder desirably has an average particle diameter of 0.5 μm or more and 10 μm or less.

Subsequently, the above-mentioned powders are weighed to give a desired composition and are mixed and pulverized by a technique such as a ball mill. The mixing and pulverization are important. That is, the crystallinity of the carbon material is intentionally destroyed by simultaneously mixing the carbon material and the matrix materials with a ball mill. On this occasion, the crystallinity of the carbon material is controlled by selecting the mixing time and the carbon material.

The thus prepared powder mixture is molded and sintered by hot pressing. Instead of the hot pressing, plasma arc sintering or hot hydrostatic pressure sintering may be employed. Though it depends on the composition of a sputtering target, the retention temperature for the sintering is in a range of 1200 to 1500° C. in many cases. The applied pressure is 25 MPa to 35 MPa. Under such sintering conditions, it is also necessary to prevent agglomerate formation of the C powders.

The sintered compact taken out from the hot press is subjected to hot isostatic pressing. The hot isostatic pressing is effective for increasing the density of the sintered compact. The retention temperature in the hot isostatic pressing depends on the composition of the sintered compact and is in the range of 1000 to 1500° C. in many cases. The applied pressure is set to 100 MPa or more.

The thus prepared sintered compact is processed into a desired shape with a lathe so as to be able to produce a sputtering target of the present invention.

It is thus possible to produce a sputtering target for a magnetic recording film, the sputtering target including C powders uniformly and finely dispersed in an alloy, having a high density, and showing a ratio ($I_G/I_D$) of peak intensities of the G-band to the D-band of 5.0 or less in Raman scattering spectrometry. The thus-produced sputtering target of the present invention is useful as a sputtering target for forming a magnetic thin film having a granular structure.

EXAMPLES

The present invention will now be described by examples and comparative Examples. These examples are merely exemplary and are not intended to limit the scope of the invention. That is, the present invention is limited only by the claims and encompasses various modifications in addition to examples included in the present invention.

Comparative Example 1

A Fe powder having an average particle diameter of 3 μm, a Pt powder having an average particle diameter of 3 μm, and carbon black having an average primary particle diameter of 48 nm were prepared as raw material powders. In Comparative Example 1, these powders were weighed to give a composition of 30Fe-30Pt-40C (mol %) and the total weight of 2600 g. The carbon black used as the C powder was commercially available one.

Subsequently, the weighed powders were placed in a mortar and were mixed and pulverized for 4 hours. The powder mixture taken out from the mortar was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber and was then hot isostatic pressed at 1100° C. and 150 MPa. The density of the thus produced sintered compact was measured by an Archimedes method, and the relative density calculated was 93.6%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

Figure 2:
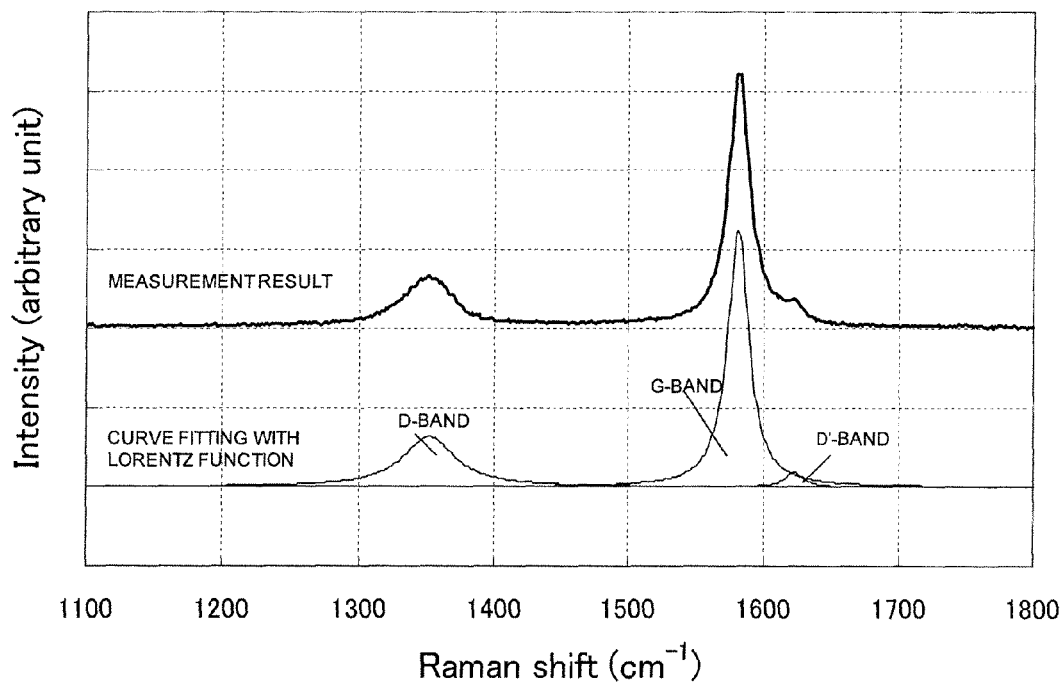
FIG. 2 shows the Raman scattering spectrum of Fe—Pt—C in Comparative Example 1 and the result of curve fitting thereof.

The curve fitting of the measurement results was performed using a Lorentz function. FIG. 2 shows the Raman scattering spectrum of Fe—Pt—C in Comparative Example 1 and the result of curve fitting thereof.

The $I_G/I_D$ ratio determined from FIG. 2 is shown in Table 1. Table 1 shows $I_D$, $I_G$, and $I_G/I_D$ ratio. The results in Examples described below are similarly shown. As obvious from Table 1, the $I_G/I_D$ ratio was 5.12, which was higher than 5.0 defined in the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter and was 19600, as shown in the Table 1.

TABLE 1

| | Composition (mol %) | Type of carbon | $I_G$ | $I_D$ | $I_G/I_D$ | Number of particles | Hot press temperature (° C.) | HIP temperature (° C.) |
|---|---|---|---|---|---|---|---|---|
| Comparative Example 1 | Fe—30Pt—40C | carbon black | 16228.2 | 3166.7 | 5.12 | 19600 | 1400 | 1100 |
| Comparative Example 2 | Fe—30Pt—40C | graphite 1 um | 16135 | 2768.4 | 5.83 | 21600 | 1400 | 1100 |
| Comparative Example 3 | Fe—30Pt—40C | graphite 20 um | 19256 | 2973.8 | 6.48 | 28600 | 1400 | 1100 |
| Example 1 | Fe—30Pt—40C | graphite 1um | 9441 | 1904.6 | 4.96 | 490 | 1400 | 1100 |
| Example 2 | Fe—30Pt—40C | carbon black | 6565.7 | 1573.6 | 4.17 | 350 | 1400 | 1100 |
| Example 3 | Fe—30Pt—40C | glassy carbon | 5163.3 | 1483.5 | 3.48 | 330 | 1400 | 1100 |
| Example 4 | Fe—30Pt—40C | graphite 20 um | 7121.3 | 2340.5 | 3.04 | 250 | 1400 | 1100 |
| Example 5 | Fe—60Pt—10C | carbon black | 8617.1 | 2215.1 | 3.89 | 80 | 1400 | 1100 |
| Example 6 | Fe—60Pt—20C | carbon black | 7031.7 | 1819.7 | 3.86 | 165 | 1400 | 1100 |
| Example 7 | Fe—60Pt—5C | carbon black | 5822.8 | 2103.3 | 2.77 | 35 | 1400 | 1100 |
| Example 8 | Fe—34Pt—2B—30C | carbon black | 6055 | 1915.2 | 3.16 | 280 | 1400 | 1100 |
| Example 9 | Fe—35Pt—5Ru—25C | carbon black | 7311.7 | 1809.4 | 4.04 | 200 | 1400 | 1100 |
| Example 10 | Fe—35Pt—10Ag—30C | carbon black | 8877.1 | 8049.6 | 1.10 | 305 | 950 | 950 |
| Example 11 | Fe—34Pt—2Au—30C | carbon black | 7133.6 | 1971.4 | 3.62 | 270 | 1400 | 1100 |
| Example 12 | Fe—30Pt—10Cu—30C | carbon black | 8622.1 | 2349.8 | 3.67 | 300 | 1400 | 1100 |
| Example 13 | Fe—25Pt—20Ru—5C | carbon black | 5369.9 | 1682.4 | 3.19 | 25 | 1400 | 1100 |
| Example 14 | Fe—34Pt—20C—5TiO$_2$—5SiO$_2$—2Cr$_2$O$_3$ | carbon black | 6606.4 | 1996.6 | 3.31 | 75 | 1100 | 1100 |
| Example 15 | Fe—35Pt—20C—5Ta$_2$O$_5$—5SiO$_2$ | carbon black | 6956.8 | 2169.2 | 3.21 | 60 | 1100 | 1100 |
| Example 16 | Fe—40Pt—20C—2B$_2$O$_3$—3CoO | carbon black | 7433 | 1986.7 | 3.74 | 65 | 1100 | 1100 |
| Example 17 | Fe—31Pt—20C—5SiO$_2$—3Co$_3$O$_4$ | carbon black | 8651.7 | 2729.4 | 3.17 | 80 | 1100 | 1100 |
| Example 18 | Fe—25Pt—50C | carbon black | 9384.5 | 2233.4 | 4.20 | 670 | 1400 | 1100 |
| Example 19 | Fe—20Pt—60C | carbon black | 9124.9 | 2160.6 | 4.22 | 980 | 1400 | 1100 |

Comparative Example 2

A Fe powder having an average particle diameter of 3 µm, a Pt powder having an average particle diameter of 3 µm, and graphite having an average particle diameter of 1 µm were prepared as raw material powders. In Comparative Example 2, these powders were weighed to give a composition of 30Fe-30Pt-40C (mol %) and the total weight of 2600 g. The graphite used as the C powder was commercially available one.

Subsequently, the weighed powders were placed in a mortar and were mixed and pulvelized for 4 hours. The powder mixture taken out from the mortar was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber and was then hot isostatic pressed at 1100° C. and 150 MPa. The density of the thus produced sintered compact was measured by an Archimedes method, and the relative density calculated was 94.2%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Comparative Example 2 and the result of curve fitting thereof. As obvious from Table 1, the $I_G/I_D$ ratio was 5.83, which was higher than 5.0 defined in the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 21600 as shown in Table 1.

Comparative Example 3

A Fe powder having an average particle diameter of 3 µm, a Pt powder having an average particle diameter of 3 µm, graphite having an average particle diameter of 20 µm were prepared as raw material powders. In Comparative Example 3, these powders were weighed to give a composition of 30Fe-30Pt-40C (mol %) and the total weight of 2600 g. The graphite used as the C powder was commercially available one.

Subsequently, the weighed powders were placed in a mortar and were mixed and pulvelized for 4 hours. The powder mixture taken out from the mortar was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber and was then hot isostatic pressed at 1100° C. and 150 MPa. The density of the thus produced sintered compact was measured by an Archimedes method, and the relative density calculated was 93.8%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Comparative Example 3 and the result of curve fitting thereof As obvious from Table 1, the $I_G/I_D$ ratio was 6.48, which was higher than 5.0 defined in the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 28600 as shown in Table 1.

Example 1

A Fe powder having an average particle diameter of 3 μm, a Pt powder having an average particle diameter of 3 μm, graphite having an average particle diameter of 1 μm, were prepared as raw material powders. In Example 1, these powders were weighed to give acomposition of 30Fe-30Pt-40C (mol %) and the total weight of 2600 g. The graphite used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 96.6%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

Figure 3:
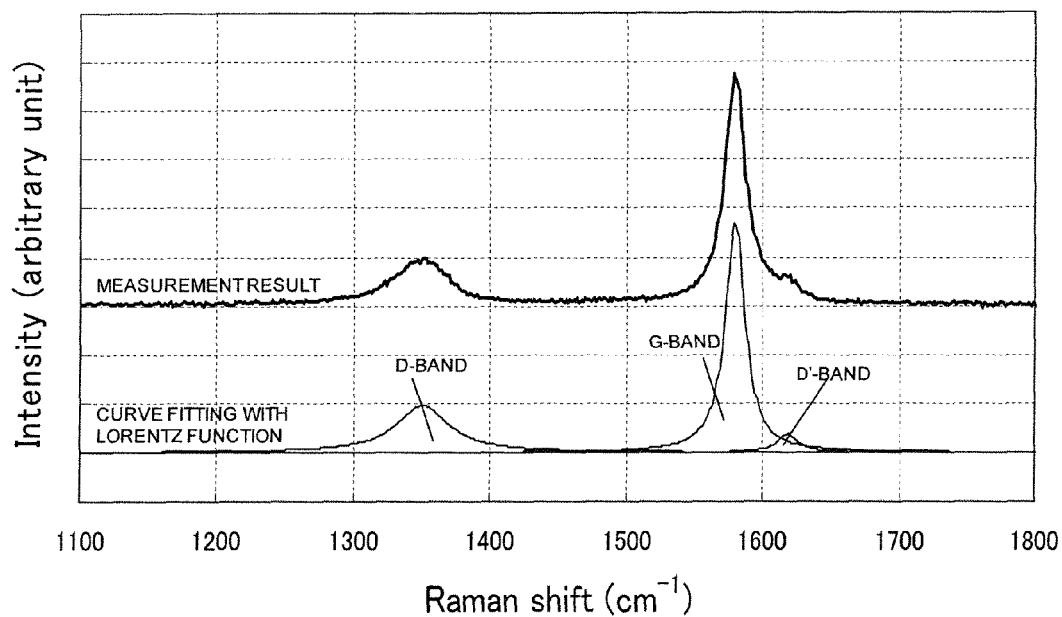
FIG. 3 shows the Raman scattering spectrum of Fe—Pt—C in Example 1 and the result of curve fitting thereof.

The curve fitting of the measurement results was performed using a Lorentz function. FIG. 3 shows the Raman scattering spectrum of Fe—Pt—C in Example 1 and the result of curve fitting thereof.

Table 1 shows the $I_G/I_D$ ratio determined from FIG. 3. As obvious from Table 1, the $I_G/I_D$ ratio was 4.96, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 490 as shown in Table 1, which was notably reduced compared with Comparative Examples.

Example 2

A Fe powder having an average particle diameter of 3 μm, a Pt powder having an average particle diameter of 3 μm, carbon black having an average primary particle diameter of 48 nm were prepared as raw material powders. In Example 2, these powders were weighed to give a composition of 30Fe-30Pt-40C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 96.9%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

Figure 4:
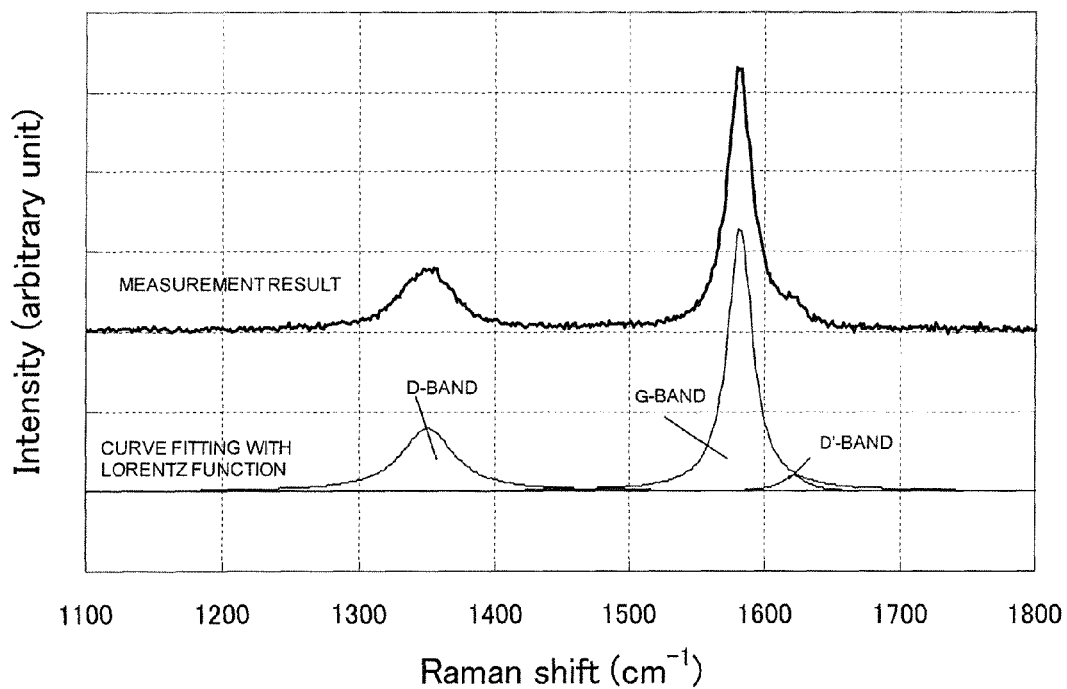
FIG. 4 shows the Raman scattering spectrum of Fe—Pt—C in Example 2 and the result of curve fitting thereof.

The curve fitting of the measurement results was performed using a Lorentz function. FIG. 4 shows the Raman scattering spectrum of Fe—Pt—C in Example 2 and the result of curve fitting thereof.

Table 1 shows the $I_G/I_D$ ratio determined from FIG. 4. As obvious from Table 1, the $I_G/I_D$ ratio was 4.17, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 350 as shown in Table 1, which was notably reduced compared with Comparative Examples.

Example 3

A Fe powder having an average particle diameter of 3 μm, a Pt powder having an average particle diameter of 3 μm, and glassy carbon having an average particle diameter of 80 μm were prepared as raw material powders. In Example 3, these powders were weighed to give a composition of 30Fe-30Pt-40C (mol %) and the total weight of 2600 g. The amorphous carbon used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 96.8%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

Figure 5:
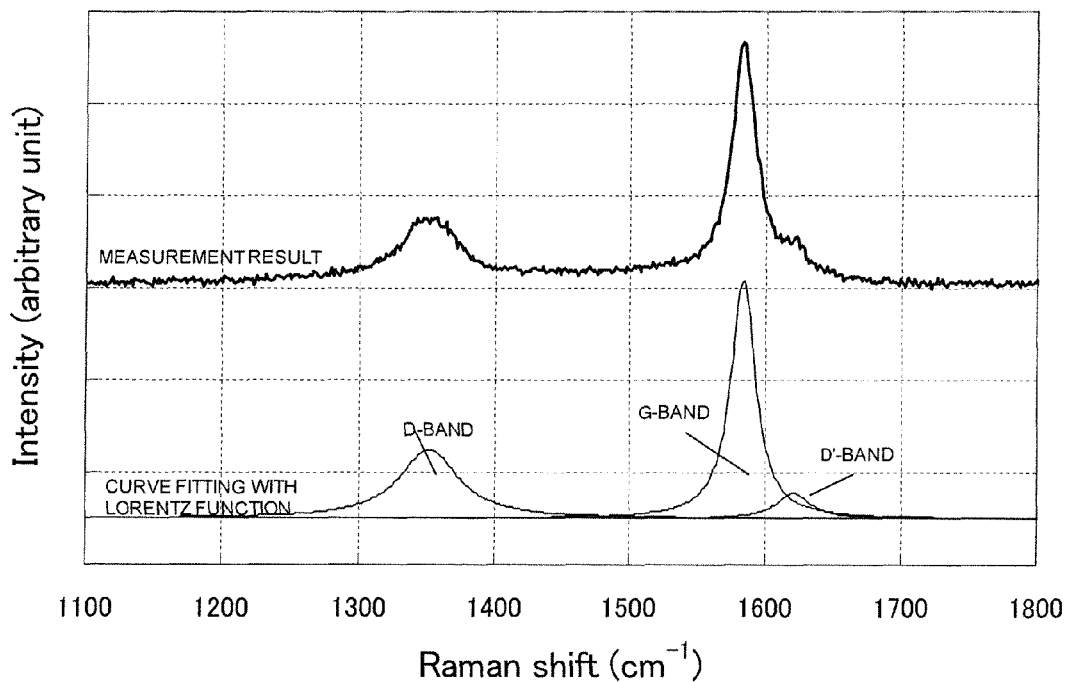
FIG. 5 shows the Raman scattering spectrum of Fe—Pt—C in Example 3 and the result of curve fitting thereof.

The curve fitting of the measurement results was performed using a Lorentz function. FIG. 5 shows the Raman scattering spectrum of Fe—Pt—C in Example 3 and the result of curve fitting thereof.

Table 1 shows the $I_G/I_D$ ratio determined from FIG. 5. As obvious from Table 1, the $I_G/I_D$ ratio was 3.48, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 330 as shown in Table 1, which was notably reduced compared with Comparative Examples.

Example 4

A Fe powder having an average particle diameter of 3 μm, a Pt powder having an average particle diameter of 3 μm, and graphite having an average particle diameter of 20 μm were prepared as raw material powders. In Example 4, these powders were weighed to give a composition of 30Fe-30Pt-40C (mol %) and the total weight of 2600 g. The graphite used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 97.1%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

Figure 6:
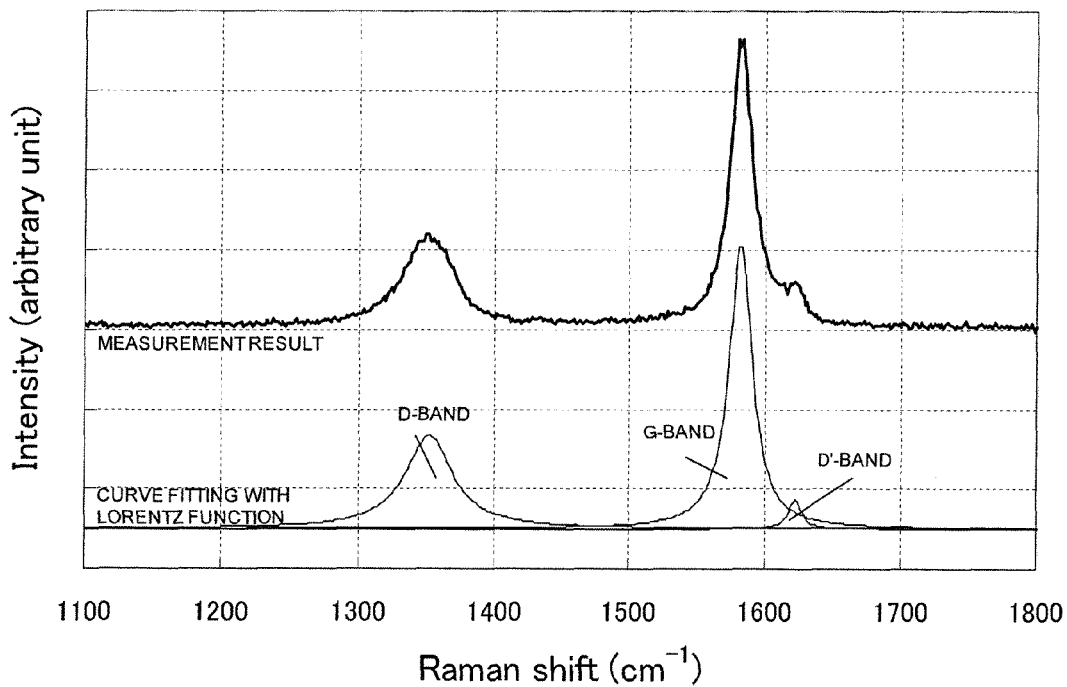
FIG. 6 shows the Raman scattering spectrum of Fe—Pt—C in Example 4 and the result of curve fitting thereof.

The curve fitting of the measurement results was performed using a Lorentz function. FIG. 6 shows the Raman scattering spectrum of Fe—Pt—C in Example 4 and the result of curve fitting thereof.

Table 1 shows the $I_G/I_D$ ratio determined from FIG. 6. As obvious from Table 1, the $I_G/I_D$ ratio was 3.04, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 330 as shown in Table 1, which was notably reduced compared with Comparative Examples.

As shown in Examples above, the ratio $(I_G/I_D)$ of peak intensities of the G-band to the D-band in Raman scattering spectrometry was 5.0 or less, and also there was a tendency that the number of particles decreases with a reduction of the intensity ratio.

From the results above, intentional destruction of the crystallinity of carbon has excellent effects of improving the sputtering characteristics of the carbon material and reducing the occurrence of particles during sputtering.

Example 5

A Fe powder having an average particle diameter of 3 μm, a Pt powder having an average particle diameter of 3 μm, carbon black having an average primary particle diameter of 48 nm were prepared as raw material powders. In Example 5, these powders were weighed to give a composition of 30Fe-60Pt-10C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 98.2%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Example 5 and the result of curve fitting thereof. As obvious from Table 1, the $I_G/I_D$ ratio was 3.89, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 80 as shown in Table 1, which was notably reduced compared with Comparative Examples.

Example 6

A Fe powder having an average particle diameter of 3 μm, a Pt powder having an average particle diameter of 3 μm, and carbon black having an average primary particle diameter of 48 μm were prepared as raw material powders. In Example 6, these powders were weighed to give a composition of 20Fe-60Pt-20C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 97.7%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Example 6 and the result of curve fitting thereof. As obvious from Table 1, the $I_G/I_D$ ratio was 3.86, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 165 as shown in Table 1 which was notably reduced compared with Comparative Examples.

Example 7

A Fe powder having an average particle diameter of 3 μm, a Pt powder having an average particle diameter of 3 μm, and carbon black having an average primary particle diameter of 48 nm were prepared as raw material powders. In Example 7, these powders were weighed to give a composition of 35Fe-60Pt-5C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 99.2%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm. The curve fitting of the measurement results was performed using a Lorentz function. Table 1 shows the $I_G/I_D$ ratio determined from the Raman scattering spectrum of Fe—Pt—C in Example 7 and the result of curve fitting thereof As obvious from Table 1, the $I_G/I_D$ ratio was 2.77, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 35 as shown in Table 1, which was notably reduced compared with Comparative Examples.

Example 8

A Fe powder having an average particle diameter of 3 μm, a Pt powder having an average particle diameter of 3 μm, a B powder having an average particle diameter of 10 μm, and carbon black having an average primary particle diameter of 48 nm were prepared as raw material powders. In Example 8, these powders were weighed to give a composition of 34Fe-34Pt-2B-30C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 97.3%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 Umm.

The curve fitting of the measurement results was performed using a Lorentz function. Table 1 shows the $I_G/I_D$ ratio determined from the Raman scattering spectrum of Fe—Pt—B-C in Example 8 and the result of curve fitting thereof. As obvious from Table 1, the $I_G/I_D$ ratio was 3.16, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 280 as shown in Table 1, which was notably reduced compared with Comparative Examples.

Example 9

A Fe powder having an average particle diameter of 3 μm, a Pt powder having an average particle diameter of 3 μm, a Ru powder having an average particle diameter of 3 μm, and carbon black having an average primary particle diameter of 48 nm were prepared as raw material powders. In Example 9, these powders were weighed to give a composition of 35Fe-35Pt-5Ru-25C(mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 98.0%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—Ru—C in Example 9 and the result of curve fitting thereof. As obvious from Table 1, the $I_G/I_D$ ratio was 4.04, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 200 as shown in Table 1, which was notably reduced compared with Comparative Examples.

Example 10

A Fe powder having an average particle diameter of 3 µm, a Pt powder having an average particle diameter of 3 µm, an Ag powder having an average particle diameter of 3 µm, and carbon black having an average primary particle diameter of 48 nm were prepared as raw material powders. In Example 10, these powders were weighed to give a composition of 25Fe-35Pt-10Ag-30C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 950° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 950° C., and a retention time of 2 hours, with gradually increasing the Ar gas pressure from the start of the increase in temperature and maintaining the Ar gas pressure at 150 MPa during the retention at 950° C. After the completion of the retention, the sintered compact was naturally cooled inside the furnace.

The density of the thus produced sintered compact was measured by an Archimedes method, and the relative density calculated was 96.1%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—Ag—C in Example 10 and the result of curve fitting thereof. As obvious from Table 1, the $I_G/I_D$ ratio was 1.10, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 305 as shown in Table 1, which was notably reduced compared with Comparative Examples.

Example 11

A Fe powder having an average particle diameter of 3 µm, a Pt powder having an average particle diameter of 3 µm, an Au powder having an average particle diameter of 5 µm, and carbon black having an average primary particle diameter of 48 nm were prepared as raw material powders. In Example 11, these powders were weighed to give a composition of 34Fe-34Pt-2Au-30C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 972%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—Au—C in Example 11 and the result of curve fitting thereof. As obvious from Table 1, the $I_G/I_D$ ratio was 3.62, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 270 as shown in Table 1, which was notably reduced compared with Comparative Examples.

Example 12

A Fe powder having an average particle diameter of 3 µm, a Pt powder having an average particle diameter of 3 µm, a Cu powder having an average particle diameter of 5 µm, and carbon black having an average primary particle diameter of 48 nm were prepared as raw material powders. In Example 12, these powders were weighed to give a composition of 30Fe-30Pt-10Cu-30C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 97.9%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—Cu—C in Example 12 and the result of curve fitting thereof. As obvious from Table 1, the $I_G/I_D$ ratio was 3.67, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 300 as shown in Table 1, which was notably reduced compared with Comparative Examples.

Example 13

A Fe powder having an average particle diameter of 3 µm, a Pt powder having an average particle diameter of 3 µm, a Ru powder having an average particle diameter of 3 µm, and carbon black having an average primary particle diameter of 48 nm were prepared as raw material powders. In Example 13, these powders were weighed to give a composition of 50Fe-25Pt-20Ru-5C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 99.3%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—Ru—C in Example 13 and the result of curve fitting thereof. As obvious from Table 1, the $I_G/I_D$ ratio was 3.19, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 25 as shown in Table 1, which was notably reduced compared with Comparative Examples.

Example 14

A Fe powder having an average particle diameter of 3 µm, a Pt powder having an average particle diameter of 3 µm, carbon black having an average primary particle diameter of 48 nm, and oxide powders, i.e., a $TiO_2$ powder having an average particle diameter of 1 µm, a $SiO_2$ powder having an average particle diameter of 0.5 µm, and a $Cr_2O_3$ powder having an average particle diameter of 1 µm, were prepared as raw material powders. In Example 14, these powders were weighed to give a composition of 34Fe-34Pt-20C-5$TiO_2$-5$SiO_2$-2$Cr_2O_3$ (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1100° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 98.1%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C—$TiO_2$—$SiO_2$—$Cr_2O_3$ in Example 14 and the result of curve fitting thereof. As obvious from Table 1, the $I_G/I_D$ ratio was 3.31, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 75 as shown in Table 1, which was notably reduced compared with Comparative Examples.

Example 15

A Fe powder having an average particle diameter of 3 μm, a Pt powder having an average particle diameter of 3 μm, carbon black having an average primary particle diameter of 48 nm, and oxide powders, i.e., a $Ta_2O_5$ powder having an average particle diameter of 1 μm and a $SiO_2$ powder having an average particle diameter of 0.5 μm, were prepared as raw material powders. In Example 15, these powders were weighed to give a composition of 35Fe-35Pt-20C-5$Ta_2O_5$-5$SiO_2$ (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1100° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 98.3%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 Umm.

The curve fitting of the measurement results was performed using a Lorentz function. Table 1 shows the $I_G/I_D$ ratio determined from the Raman scattering spectrum of Fe—Pt—C—$Ta_2O_5$—$SiO_2$ in Example 15 and the result of curve fitting thereof. As obvious from Table 1, the $I_G/I_D$ ratio was 3.21, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 60 as shown in Table 1, which was notably reduced compared with Comparative Examples.

Example 16

A Fe powder having an average particle diameter of 3 μm, a Pt powder having an average particle diameter of 3 μm, carbon black having an average primary particle diameter of 48 nm, and oxide powders, i.e., a $B_2O_3$ powder having an average particle diameter of 10 μm and a CoO powder having an average particle diameter of 1 μm, were prepared as raw material powders. In Example 16, these powders were weighed to give a composition of 35Fe-40Pt-20C-2$B_2O_3$-3CoO (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1100° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 97.9%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C—$B_2O_3$—CoO in Example 16 and the result of curve fitting thereof. As obvious from Table 1, the $I_G/I_D$ ratio was 3.74, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 65 as shown in Table 1, which was notably reduced compared with Comparative Examples.

Example 17

A Fe powder having an average particle diameter of 3 μm, a Pt powder having an average particle diameter of 3 μm, carbon black having an average primary particle diameter of 48 nm, and oxide powders, i.e., a $SiO_2$ powder having an average particle diameter of 0.5 μm and a $Co_3O_4$ powder having an average particle diameter of 1 μm, were prepared as raw material powders. In Example 17, these powders were weighed to give a composition of 41Fe-31Pt-20C-5$SiO_2$-3$Co_3O_4$ (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1100° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 98.4%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm. The curve fitting of the measurement results was performed using a Lorentz function. Table 1 shows the $I_G/I_D$ ratio determined from the Raman scattering spectrum of Fe—Pt—C—$SiO_2$—$Co_3O_4$ in Example 17 and the result of curve fitting thereof. As obvious from Table 1, the $I_G/I_D$ ratio was 3.17, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 80 as shown in Table 1, which was notably reduced compared with Comparative Examples.

Example 18

A Fe powder having an average particle diameter of 3 μm, a Pt powder having an average particle diameter of 3 μm, and carbon black having an average primary particle diameter of 48 nm were prepared as raw material powders. In Example 18, these powders were weighed to give a composition of 25Fe-25Pt-50C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 96.1%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Example 18 and the result of curve fitting thereof. As obvious from Table 1, the $I_G/I_D$ ratio was 4.20, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 670 as shown in Table 1, which was notably reduced compared with Comparative Examples.

Example 19

A Fe powder having an average particle diameter of 3 μm, a Pt powder having an average particle diameter of 3 μm, and carbon black having an average primary particle diameter of 48 nm were prepared as raw material powders. In Example 19, these powders were weighed to give a composition of 20Fe-20Pt-60C (mol %) and the total weight of 2600 g. The carbon black used as the C powder was commercially available one.

Subsequently, the weighed powders were charged in a 10-Liter ball mill pot together with zirconia balls as a pulverizing medium, and mixed and pulverized by rotating for 4 hours. The powder mixture taken out from the ball mill was charged in a carbon mold and was hot pressed.

The conditions of hot pressing were a vacuum atmosphere, a rate of temperature increase of 300° C./hour, a retention temperature of 1400° C., a retention time of 2 hours, and a pressure of 30 MPa from the start of the increase in temperature until the end of the retention. After the completion of the retention, the hot pressed powder was naturally cooled inside the chamber.

The sintered compact taken out from the mold for hot pressing was hot isostatic pressed under conditions of a rate of temperature increase of 300° C./hour, a retention temperature of 1100° C., and a retention time of 2 hours, with gradually increasing the Ar gas pressure from the start of the increase in temperature and maintaining the Ar gas pressure at 150 MPa during the retention at 1100° C. After the completion of the retention, the sintered compact was naturally cooled inside the furnace.

The density of the thus produced sintered compact was measured by an Archimedes method, and the relative density calculated was 95.9%.

The sintered compact was cut with a lathe to give a target having a diameter of 180.0 mm and a thickness of 5.0 mm. The conditions for Raman scattering spectrometry of the target were an excitation wavelength of 532 nm, an output of 5 mW, and diffraction grating of 1800 L/mm.

The curve fitting of the measurement results was performed using a Lorentz function. Table 1 shows the $I_G/I_D$ ratio determined from the Raman scattering spectrum of Fe—Pt—C in Example 19 and the result of curve fitting thereof. As obvious from Table 1, the $I_G/I_D$ ratio was 4.22, which satisfied the $I_G/I_D$ ratio condition of 5.0 or less of the present invention.

The target was set in a magnetron sputtering apparatus (C-3010 sputtering system, manufactured by Canon ANELVA Corporation) and was sputtered.

Under sputtering conditions of an applied power of 1 kW and an Ar gas pressure of 1.7 Pa, after presputtering at 2 kWhr, a film was formed on an aluminum substrate having a diameter of 3.5 inches for 20 seconds. The number of particles adhered onto the substrate was counted with a particle counter, and was 980 as shown in Table 1, which was notably reduced compared with Comparative Examples.

The sputtering target for a magnetic recording film of the present invention allows production of a magnetic thin film having a granular structure without using an expensive co-sputtering apparatus. The invention can provide a sputtering target, in particular, Fe—Pt-based sputtering target, for a magnetic recording film, where C powders are dispersed in the target. The sputtering target has an excellent effect of solving the problems that Carbon is a material which is difficult to sinter and is apt to form agglomerates and that carbon masses are readily detached during sputtering to generate a large number of particles on the film after sputtering. Accordingly, the sputtering target is useful for forming a magnetic thin film having a granular structure.

The invention claimed is:

1. A sputtering target for a magnetic recording film, the sputtering target having a composition comprising 5 mol % or more and 60 mol % or less of Pt, 20 mol % or more and 70 mol % or less of C, and the balance of Fe, and having a ratio ($I_G/I_D$) of a peak intensity of G-band ($I_G$) to a peak intensity of D-band ($I_D$) of 5.0 or less in Raman scattering spectrometry of the sputtering target, and having a relative density of 90% or more.

2. A sputtering target for a magnetic recording film, the sputtering target having a composition comprising 0.5 mol % or more and 20 mol % or less of at least one element selected from the group consisting of B, Ru, Ag, Au, and Cu, 5 mol % or more and 60 mol % or less of Pt, 20 mol % or more and 70 mol % or less of C, and Fe, and having a ratio ($I_G/I_D$) of a peak intensity of G-band ($I_G$) to a peak intensity of D-band ($I_D$) of 5.0 or less in Raman scattering spectrometry of the sputtering target.

3. The sputtering target for a magnetic recording film according to claim 2, wherein the sputtering target further comprises 0.5 mol % or more and 20 mol % or less of at least one oxide selected from the group consisting of $SiO_2$, $Cr_2O_3$, CoO, $Ta_2O_5$, $B_2O_3$, MgO, and $Co_3O_4$.

4. The sputtering target for a magnetic recording film according to claim 2, wherein the sputtering target has a relative density of 90% or more.

5. A sputtering target for a magnetic recording film, the sputtering target having a composition comprising 0.5 mol % or more and 20 mol % or less of at least one oxide selected from the group consisting of $SiO_2$, $Cr_2O_3$, CoO, $Ta_2O_5$, $B_2O_3$, MgO, and $Co_3O_4$, 5 mol % or more and 60 mol % or less of Pt, 20 mol % or more and 70 mol % or less of C, and the balance of Fe, and having a ratio ($I_G/I_D$) of a peak intensity of G-band ($I_G$) to a peak intensity of D-band ($I_D$) of 5.0 or less in Raman scattering spectrometry of the sputtering target.

6. The sputtering target for a magnetic recording film according to claim 5, wherein the sputtering target has a relative density of 90% or more.

7. The sputtering target according to claim 1, wherein the 20 mol % or more and 70 mol % or less of C is in the form of carbon black.

8. The sputtering target according to claim 1, wherein the 20 mol % or more and 70 mol % or less of C is in the form of glassy carbon.

9. The sputtering target according to claim 1, wherein the 20 mol % or more and 70 mol % or less of C is in the form of graphite.

10. The sputtering target according to claim 1, wherein the sputtering target is a sintered compact of raw material powders having been mixed, pulverized, compacted, and sintered.

* * * * *